(12) United States Patent
Kao

(10) Patent No.: US 9,118,286 B2
(45) Date of Patent: Aug. 25, 2015

(54) DC OFFSET CANCELLATION CIRCUIT

(71) Applicant: Novatek Microelectronics Corp., Hsinchu (TW)

(72) Inventor: Shiau-Wen Kao, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 46 days.

(21) Appl. No.: 14/083,455

(22) Filed: Nov. 19, 2013

(65) Prior Publication Data

US 2015/0022268 A1 Jan. 22, 2015

(30) Foreign Application Priority Data

Jul. 17, 2013 (TW) .............................. 102125579 U

(51) Int. Cl.
*H03F 3/45* (2006.01)

(52) U.S. Cl.
CPC ........ *H03F 3/45071* (2013.01); *H03F 3/45183* (2013.01); *H03F 3/45475* (2013.01); *H03F 3/45968* (2013.01); *H03F 2203/45396* (2013.01); *H03F 2203/45511* (2013.01); *H03F 2203/45522* (2013.01); *H03F 2203/45526* (2013.01); *H03F 2203/45528* (2013.01); *H03F 2203/45591* (2013.01)

(58) Field of Classification Search
USPC ........................................ 330/259, 85, 9, 290
IPC .......................................................... H03F 3/45
See application file for complete search history.

(56) References Cited

U.S. PATENT DOCUMENTS

| 6,741,131 | B2 | 5/2004 | Nicklasson |
| 6,914,479 | B1 * | 7/2005 | Gabillard et al. ............... 330/69 |
| 7,020,449 | B2 | 3/2006 | Shi |
| 7,132,861 | B1 | 11/2006 | Fu et al. |
| 7,271,649 | B2 | 9/2007 | Chiu et al. |
| 7,917,114 | B2 | 3/2011 | Bagchi et al. |
| 7,969,222 | B2 | 6/2011 | Bouras |
| 8,829,991 | B2 * | 9/2014 | Jordan et al. ..................... 330/69 |
| 2005/0140445 | A1 * | 6/2005 | Kim et al. ...................... 330/258 |
| 2005/0195024 | A1 * | 9/2005 | Cheng ................................ 330/9 |

(Continued)

FOREIGN PATENT DOCUMENTS

TW 200428764 12/2004

OTHER PUBLICATIONS

"Office Action of Taiwan Counterpart Application," issued on May 11, 2015, p. 1-4.

*Primary Examiner* — Patricia T Nguyen
(74) *Attorney, Agent, or Firm* — Jianq Chyun IP Office

(57) ABSTRACT

A DC offset cancellation circuit is provided. The DC offset cancellation circuit includes a first operational amplifier and a feedback gain circuit. The first operational amplifier includes a first input transconductance stage, a second input transconductance stage and an output stage. An input terminal of the first input transconductance stage receives an input signal of the first operational amplifier through a first input terminal of the first operational amplifier. An output terminal of the output stage outputs an output signal of the first operational amplifier through an output terminal of the first operational amplifier. An input terminal of the feedback gain circuit is coupled to the output terminal of the first operational amplifier, and an output terminal of the feedback gain circuit is coupled to the input terminal of the second transconductance stage through a second input terminal of the first operational amplifier.

14 Claims, 5 Drawing Sheets

(56) References Cited

U.S. PATENT DOCUMENTS

2007/0001763 A1* 1/2007 Ju .............................. 330/259
2013/0169361 A1* 7/2013 Killat ........................... 330/253
2015/0002221 A1* 1/2015 Van Helleputte et al. ...... 330/69

* cited by examiner

DC OFFSET CANCELLATION CIRCUIT

CROSS-REFERENCE TO RELATED APPLICATION

This application claims the priority benefit of Taiwan application serial no. 102125579, filed on Jul. 17, 2013. The entirety of the above-mentioned patent application is hereby incorporated by reference herein and made a part of this specification.

BACKGROUND

1. Technical Field

The invention relates to an electronic circuit. Particularly, the invention relates to a direct current (DC) offset cancellation circuit.

2. Related Art

In an operational amplifier of a communication apparatus, when an input signal of a previous stage has a direct current (DC) offset error due to temperature or component mismatch, the error is also amplifier by a gain of the operational amplifier, and such phenomenon probably results in a fact that the operational amplifier enters a saturation mode and cannot achieve a best result. A commonly used method for cancelling the DC offset is to feed back a signal output from an output terminal of the operational amplifier to an input terminal of the operational amplifier, so as to achieve an effect of cancelling the DC offset. However, in the aforementioned method for cancelling the DC offset, since the feedback signal is directly added to the input signal of the operational amplifier, noise in the feedback circuit is also transmitted to the input terminal of the operational amplifier, and a noise figure at the input terminal of the operational amplifier is greatly increased, which increases an interference degree on signal. In order to cancel the DC offset and suppress the noise increase, some other methods have to be used, for example, to decrease an input resistance or increase an input transconductance of the operational amplifier. On the other hand, the above methods for reducing the noises may further increase a design area or power consumption of a chip.

SUMMARY

The invention is directed to a direct current (DC) offset cancellation circuit, which is capable of cancelling a DC offset phenomenon in an operational amplifier and effectively suppressing noise in a feedback gain circuit.

The invention provides a DC offset cancellation circuit including a first operational amplifier and a feedback gain circuit. The first operational amplifier includes a first input transconductance stage, a second input transconductance stage and an output stage. An input terminal of the first input transconductance stage receives an input signal of the first operational amplifier through a first input terminal of the first operational amplifier. An output terminal of the output stage outputs an output signal of the first operational amplifier through an output terminal of the first operational amplifier. An input terminal of the feedback gain circuit is coupled to the output terminal of the first operational amplifier, and an output terminal of the feedback gain circuit is coupled to an input terminal of the second input transconductance stage through a second input terminal of the first operational amplifier.

According to the above descriptions, in the DC offset cancellation circuit of the invention, the DC offset at the output terminal of the first operational amplifier is transmitted to the second input transconductance stage of the first operational amplifier through the feedback gain circuit, and the second input transconductance stage decreases the noise of the feedback gain circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
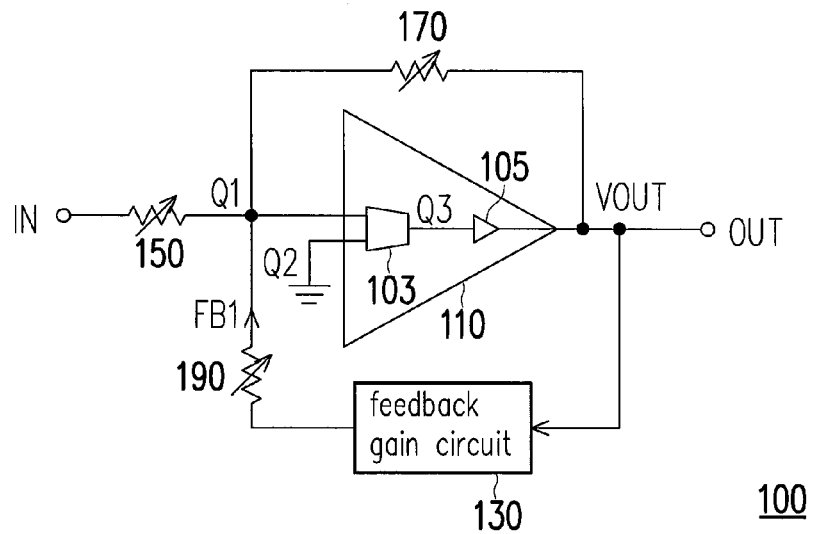
FIG. 1 is a circuit block schematic diagram of a direct current (DC) offset cancellation circuit.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a circuit block schematic diagram of a direct current (DC) offset cancellation circuit. The DC offset cancellation circuit 100 includes an operational amplifier 110, a feedback gain circuit 130, a first variable resistor 150, a second variable resistor 170 and a third variable resistor 190. Referring to FIG. 1, the operational amplifier 110 includes an input transconductance stage 103 and an output stage 105. A first input terminal of the input transconductance stage 103 is coupled to a first input terminal Q1 of the operational amplifier 110 and is coupled to the first variable resistor 150. Therefore, the first input terminal of the input transconductance stage 103 can receive an input signal IN of the operational amplifier 110 through the first variable resistor 150 and the first input terminal Q1. A second input terminal of the input transconductance stage 103 is coupled to a second input terminal Q2 of the operational amplifier 110 and is coupled to a reference voltage (for example, a ground voltage or other fixed voltage). An output terminal Q3 of the input transconductance stage 103 is coupled to an input terminal of the output stage 105. On the other hand, an output terminal of the output stage 105 is coupled to an output terminal VOUT of the operational amplifier 110, and is configured to output an output signal OUT of the operational amplifier 110. A first end and a second end of the second variable resistor 170 are respectively coupled to the first input terminal Q1 of the operational amplifier 110 and the output terminal VOUT of the operational amplifier 110.

In the embodiment of FIG. 1, a gain of the operational amplifier 110 can be determined according to a resistance value between the first variable resistor 150 and the second variable resistor 170. For example, when resistance values of the first variable resistor 150 and the second variable resistor 170 are respectively RA and RB, the gain of the operational amplifier 110 can be represented as RB/RA. When the input signal IN of the operational amplifier 110 has a DC offset error, the error can be amplified by the gain of the operational amplifier 110, and the amplified error probably makes the operational amplifier 110 to enter a saturation mode, i.e. the output signal OUT of the operational amplifier 110 is saturated. In order to eliminate the DC offset of the output terminal VOUT of the operational amplifier 110, the feedback gain circuit 130 and the third variable resistor 190 are added between the output terminal VOUT and the first input terminal Q1 of the operational amplifier 110. A signal input terminal of the feedback gain circuit 130 is coupled to the output terminal VOUT of the operational amplifier 110, and a signal output terminal of the feedback gain circuit 130 is coupled to the first input terminal Q1 of the operational amplifier 110 through the third variable resistor 190 for outputting a feedback signal FB1 to the operational amplifier 110. On the other hand, as the feedback gain circuit 130 directly transmits the feedback signal FB1 to the first input terminal Q1 of the operational amplifier 110, the noise in the feedback gain circuit 130 is also fed back to the first input terminal Q1 of the operational amplifier 110, and a noise figure (NF) of the operational amplifier 110 is increased.

In order to resolve the problem that the noise in internal of the feedback gain circuit 130 influences the main circuit in the DC offset cancellation circuit 100, in the following embodiments, the DC offset cancellation circuit is used to decrease the noise of the feedback gain circuit.

Figure 2:
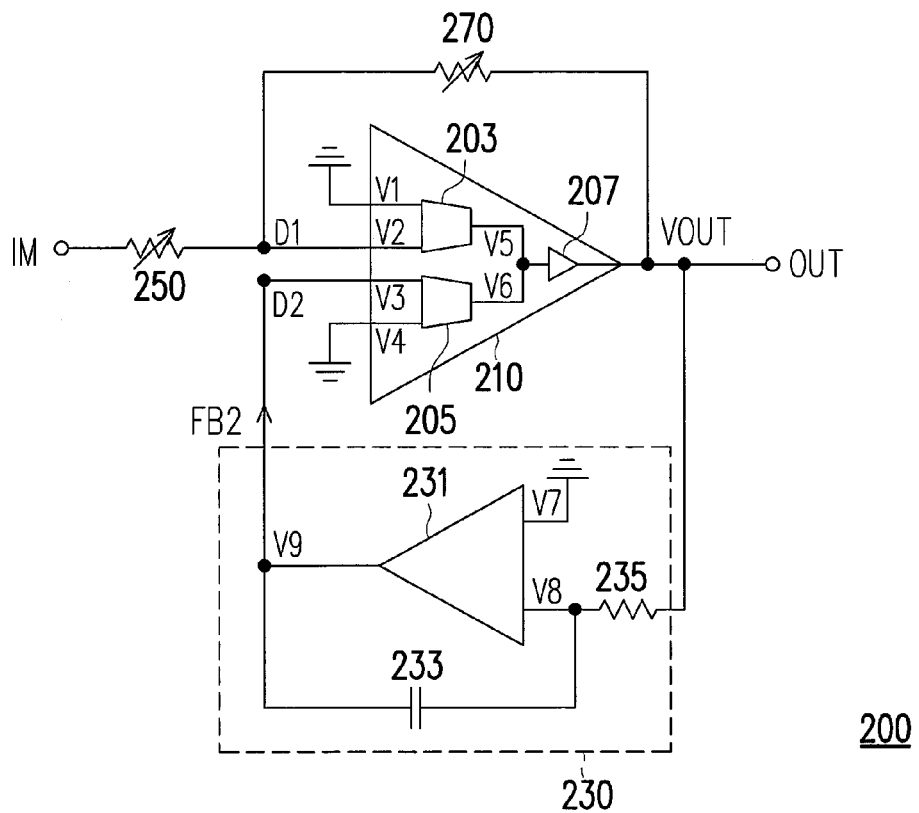
FIG. 2 is a schematic diagram of a DC offset cancellation circuit according to a first embodiment of the invention.

FIG. 2 is a schematic diagram of a DC offset cancellation circuit 200 according to a first embodiment of the invention. The DC offset cancellation circuit 200 includes a first operational amplifier 210, a feedback gain circuit 230, a first variable resistor 250 and a second variable resistor 270. A first input terminal D1 of the first operational amplifier 210 is coupled to the first variable resistor 250 for receiving an input signal IM. A first end and a second end of the second variable resistor 270 are coupled to the first input terminal D1 of the first operational amplifier and the output terminal VOUT of the first operational amplifier. The gain of the first operational amplifier 210 can be determined according to resistance values of the first variable resistor 250 and the second variable resistor 270 (referring to the related description of FIG. 1, and details thereof are not repeated). An input terminal of the feedback gain circuit 230 is coupled to the output terminal VOUT of the first operational amplifier 210. An output terminal of the feedback gain circuit 230 is coupled to a second input terminal D2 of the first operational amplifier 210.

The first operational amplifier 210 includes a first input transconductance stage 203, a second input transconductance stage 205 and an output stage 207. The first input transconductance stage 203 has a first gain, and the second input transconductance stage 205 has a second gain. According to an actual product design, the first gain and the second gain can be set to the same or different. Moreover, the second gain of the second input transconductance stage 205 can be fixed. In some embodiments, the second gain of the second input transconductance stage 205 can be a variable gain, i.e. the second input transconductance stage 205 may dynamically determine the second gain according to a control signal.

The first input transconductance stage 203 includes a first input terminal V1, a second input terminal V2 and an output terminal V5. The second input transconductance stage 205 includes a first input terminal V3, a second input terminal V4 and an output terminal V6. The first input terminal V1 of the first input transconductance stage 203 and the second input terminal V4 of the second input transconductance stage 205 are coupled to a reference voltage (for example, a ground voltage or other constant voltage). The second input terminal V2 of the first input transconductance stage 203 is coupled to the first input terminal D1 of the first operational amplifier 210, and is coupled to the first variable resistor 250 to receive the input signal IM of the first operational amplifier 210. The first input terminal V3 of the second input transconductance stage 205 is coupled to the second input terminal D2 of the first operational amplifier 210 to receive a feedback signal FB2 output by the feedback gain circuit 230. The output terminal V5 of the first input transconductance stage 203 and the output terminal V6 of the second input transconductance stage 205 are commonly coupled to the input terminal of the output stage 207. The output terminal of the output stage 207 is coupled to the output terminal VOUT of the first operational amplifier 210 to output the output signal OUT of the first operational amplifier 210.

The input terminal of the feedback gain circuit 230 is coupled to the output terminal VOUT of the first operational amplifier 210 for receiving the output signal OUT of the first operational amplifier 210. On the other hand, the output terminal of the feedback gain circuit 230 is coupled to the first input terminal V3 of the second input transconductance stage 205 through the second input terminal D2 of the first operational amplifier 210. The feedback gain circuit 230 receives the output signal OUT of the first operational amplifier 210, and transmits DC offset information (i.e. the feedback signal FB2) of the output signal OUT to the second input transconductance stage 205 of the first operational amplifier 210. Since the feedback signal FB2 has the DC offset information related to the first operational amplifier 210, the second input transconductance stage 205 may generate a corresponding current in response to the DC offset and output the same to the output stage 207. By outputting the corresponding current, the second input transconductance stage 205 may compensate/cancel a DC offset component in a bias current output to the output stage 207 by the first input transconductance stage 203. Therefore, the DC offset cancellation circuit 200 may cancel the DC offset of the input signal IM. According to such circuit design, the second input transconductance stage 205 can be effectively used to suppress the noise in the feedback gain circuit 230, and while the DC offset cancellation circuit 200 cancels the DC offset, the noise generated by the feedback gain circuit 230 can also be decreased. In order to maintain consistence of a high pass frequency of the DC offset cancellation circuit 200 under different signal gains, a transconductance value of the second input transconductance stage 205 can be varied along with the signal gains. Implementation detail of the first operational amplifier 210 is described later.

In an embodiment of the invention, the feedback gain circuit 230 can be implemented by a second operational amplifier 231, a capacitor 233 and a resistor 235, though the invention is not limited thereto, and any circuit capable of receiving the output signal OUT of the first operational amplifier 210 through the signal input terminal and transmitting the feedback signal FB2 to the second input transconductance stage 205 of the first operational amplifier 210 through the signal output terminal can be used to implement the feedback gain circuit 230 of the invention.

In an embodiment of the invention, the second operational amplifier 231 includes a first input terminal V7, a second input terminal V8 and an output terminal V9. The first input terminal V7 of the second operational amplifier 231 is coupled to a reference voltage (for example, the ground voltage or other fixed voltage), the output terminal V9 of the second operational amplifier 231 is coupled to the output terminal of the feedback gain circuit 230, and is coupled to the second input terminal D2 of the first operational amplifier 210 for outputting the feedback signal FB2 to the input terminal V3 of the second input transconductance stage 205. A first end and a second end of the capacitor 233 are respectively coupled to the second input terminal V8 and the output terminal V9 of the second operational amplifier 231. A first end and a second end of the resistor 235 are respectively coupled to the second input terminal V8 of the second operational amplifier 231 and the output terminal VOUT of the first operational amplifier 210. Therefore, the feedback gain circuit 230 has a function of an integrator. The feedback circuit 230 may accumulate the DC offset information related to the first operational amplifier 210 for correspondingly outputting the feedback signal FB2 to the second input transconductance stage 205 of the first operational amplifier 210.

By comparing the internal components of the operational amplifier 110 of FIG. 1 and the first operational amplifier 210 of FIG. 2, it is known that the first operational amplifier 210 of FIG. 2 has another set of input transconductance stage compared to the operational amplifier 100 of FIG. 1. By comparing coupling positions of the output terminals of the feedback gain circuit 130 and the feedback gain circuit 230 in FIG. 1 and FIG. 2, the feedback signal FB1 of the feedback gain circuit 130 in FIG. 1 is directly transmitted to the first input terminal Q1 of the operational amplifier 110. In the embodiment of FIG. 2, the feedback signal FB2 of the feedback gain circuit 230 is transmitted to the first input terminal V3 of the second input transconductance stage 205 through the second input terminal D2 of the first operational amplifier 210 without being transmitted to the second input terminal V2 of the first input transconductance stage 203. Different to the embodiment of FIG. 1 that the feedback signal FB1 of the feedback gain circuit 130 in FIG. 1 is directly transmitted to the input transconductance stage 103 of the operational amplifier 110, in the embodiment of FIG. 2, the feedback signal FB2 is transmitted to the second input transconductance stage 205 of the operational amplifier. According to such circuit design, the noise in the feedback gain circuit 230 can be effectively suppressed by the second input transconductance stage 205 without adding the noise to the input signal IM of the first operational amplifier 210. Therefore, the DC offset cancellation circuit 200 can also decrease the noise generated by the feedback gain circuit 230 while cancelling the DC offset.

Figure 3:
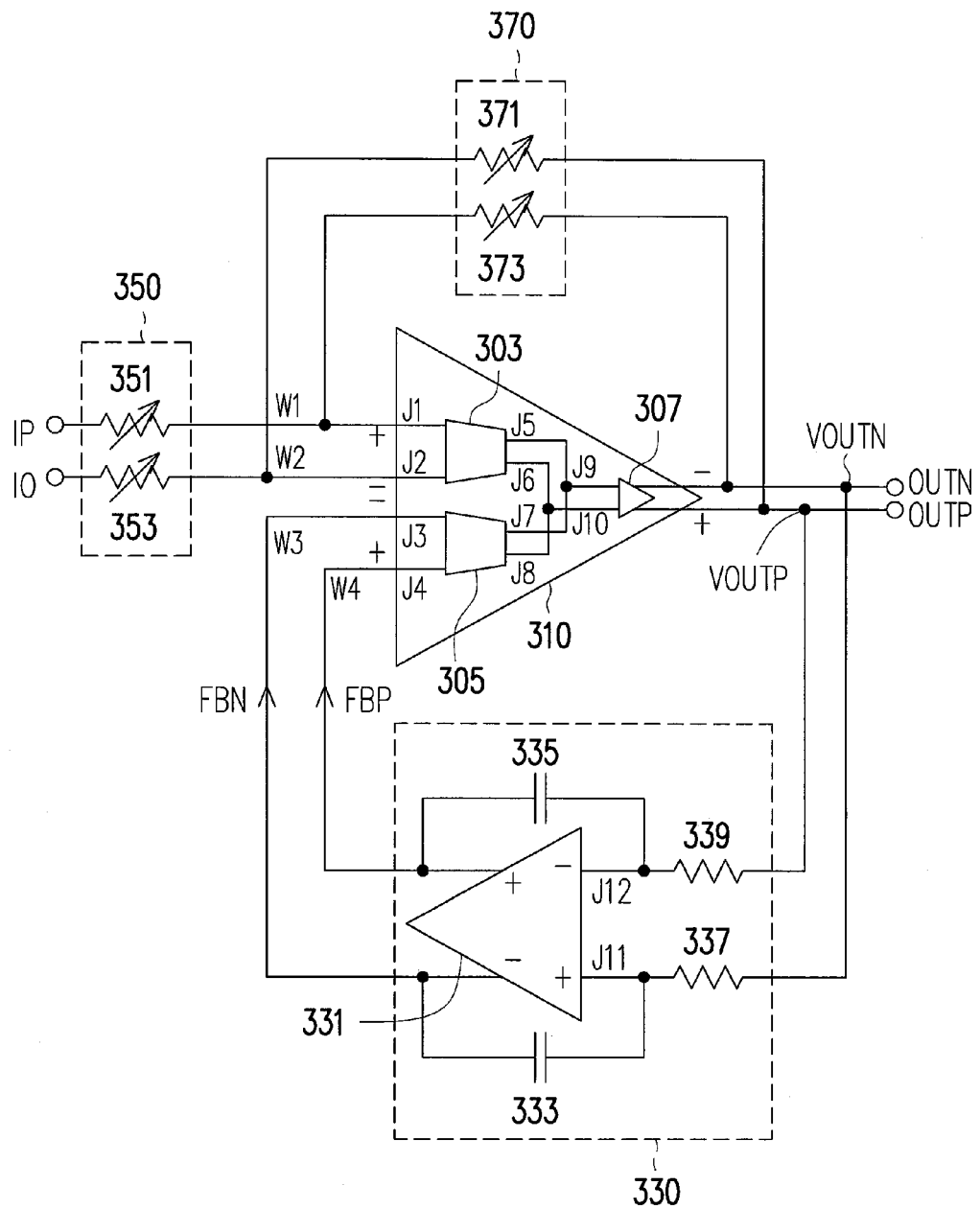
FIG. 3 is a schematic diagram of a DC offset cancellation circuit according to a second embodiment of the invention.

In FIG. 2, the DC offset cancellation circuit 200 is implemented by an operational amplifier with a single output terminal, though the invention is not limited thereto. In another embodiment of the invention, the DC offset cancellation circuit can also be implemented by a differential amplifier. For example, FIG. 3 is a schematic diagram of a DC offset cancellation circuit 300 according to a second embodiment of the invention. The embodiment of FIG. 3 can be deduced according to related descriptions of FIG. 2. Referring to FIG. 3, the DC offset cancellation circuit 300 includes a first operational amplifier 310, a feedback gain circuit 330, a first variable resistor array 350 and a second variable resistor array 370.

A non-inverting input terminal W1 of the first operational amplifier 310 is coupled to a variable resistor 351 in the first variable resistor array 350 for receiving an input signal IP. A first inverting input terminal W2 of the first operational amplifier 310 is coupled to a variable resistor 353 in the first variable resistor array 350 for receiving an input signal IO. The input signal IP and the input signal IO are differential signals. A first end and a second end of a variable resistor 371 in the second variable resistor array 370 are respectively coupled to the first inverting input terminal W2 of the first operational amplifier 310 and a non-inverting output terminal VOUTP of the first operational amplifier 310. A first end and a second end of a variable resistor 373 in the second variable resistor array 370 are respectively coupled to the first non-inverting input terminal W1 of the first operational amplifier 310 and an inverting output terminal VOUTN of the first operational amplifier 310. An inverting output terminal and a non-inverting output terminal of the feedback gain circuit 330 are respectively coupled to a second inverting input terminal W3 and a second non-inverting input terminal W4 of the first operational amplifier 310.

The first operational amplifier 310 includes a first input transconductance stage 303, a second input transconductance stage 305 and an output stage 307. The first input transconductance stage 303 includes a first input terminal J1, a second input terminal J2, a first signal output terminal J5 and a second signal output terminal J6. The second input transconductance stage 305 includes a first input terminal J3, a second input terminal J4, a first signal output terminal J7 and a second signal output terminal J8. The first input terminal J1 of the first input transconductance stage 303 is coupled to the first non-inverting input terminal W1 of the first operational amplifier 310, and is coupled to the variable resistor 351 of the first variable resistor array 350 for receiving the input signal IP of the first operational amplifier 310. The second input terminal J2 of the first input transconductance stage 303 is coupled to the first inverting input terminal W2 of the first operational amplifier 310, and is coupled to the variable resistor 353 of the first variable resistor array 350 for receiving the input signal IO of the first operational amplifier 310. The first input terminal J3 of the second input transconductance stage 305 is coupled to the second inverting input terminal W3 of the first operational amplifier 310 for receiving a feedback signal FBN output by the feedback gain circuit 330. The second input terminal J4 of the second input transconductance stage 305 is coupled to the second non-inverting input terminal W4 of the first operational amplifier 310 for receiving a feedback signal FBP output by the feedback gain circuit 330. The feedback signal FBP and the feedback signal FBN are differential signals.

The first signal output terminal J5 of the first input transconductance stage 303 and the first signal output terminal J7 of the second input transconductance stage 305 are commonly coupled to a first input terminal J9 of the output stage 307. The second signal output terminal J6 of the first input transconductance stage 303 and the second signal output terminal J8 of the second input transconductance stage 305 are commonly coupled to a second input terminal J10 of the output stage 307. A first output terminal and a second output terminal of the output stage 307 are respectively coupled to the non-inverting output terminal VOUTP and the inverting output terminal VOUTN of the first operational amplifier 310 for respectively outputting the output signals OUTP and OUTN of the first operational amplifier 310. The output signal OUTP and the output signal OUTN are differential signals. The inverting output terminal VOUTN and the non-inverting output terminal VOUTP of the first operational amplifier 310 respectively represent the first output terminal and the second output terminal of the first operational amplifier 310.

A first input terminal and a second input terminal of the feedback gain circuit 330 are respectively coupled to the inverting output terminal VOUTN and the non-inverting output terminal VOUTP of the first operational amplifier 310 for receiving the output signals OUTN and OUTP of the first operational amplifier 310. On the other hand, the first output terminal and the second output terminal of the feedback gain circuit 330 are respectively coupled to the first input terminal J3 and the second input terminal J4 of the second input transconductance stage 305 through the second inverting input terminal W3 and the second non-inverting input terminal W4 of the first operational amplifier 310. The feedback gain circuit 330 receives the output signal OUTN and the output signal OUTP of the first operational amplifier 310, and transmits the DC offset information (i.e. the feedback signal BN and the feedback signal FBP) of the output signal OUTN and the output signal OUTP to the second input transconductance stage 305 of the first operational amplifier 310. Since the feedback signals FBN and FBP have the DC offset information related to the first operational amplifier 310, the second input transconductance stage 305 can generate a corresponding current in response to the DC offset to the output stage 307. By outputting the corresponding current, the second input transconductance stage 305 can compensate/cancel the DC offset component in the current output to the output stage 307 by the first input transconductance stage 303. Therefore, the DC offset cancellation circuit 300 can cancel the DC offset of the input signal IP and the input signal J0. According to such circuit design, the second input transconductance stage 305 can be effectively used to suppress the noise in the feedback gain circuit 330. Therefore, the DC offset cancellation circuit 300 can also decrease the noise generated by the feedback gain circuit 230 while cancelling the DC offset. In order to maintain consistence of a high pass frequency of the DC offset cancellation circuit 300 under different signal gains, a transconductance value of the second input transconductance stage 305 can be varied along with the signal gains. Implementation detail of the first operational amplifier 310 is described later.

In an embodiment of the invention, the feedback gain circuit 330 can be implemented by a second operational amplifier 331, a first capacitor 333, a second capacitor 335, a first resistor 337 and a second resistor 339, though the invention is not limited thereto, and any circuit capable of receiving the output signal OUTN and the output signal OUTP of the first operational amplifier 310 through the signal input terminal and transmitting the feedback signal FBN and the feedback signal FBP to the second input transconductance stage 305 of the first operational amplifier 310 through the signal output terminal can be used to implement the feedback gain circuit 330 of the invention.

The second operational amplifier 331 includes a first input terminal J11, a second input terminal J12, a first output terminal and a second output terminal, where the first output terminal is an inverting output terminal, and the second output terminal is a non-inverting output terminal. A first end and a second end of the first capacitor 333 are respectively coupled to the first input terminal J11 of the second operational amplifier 331 and the first output terminal of the second operational amplifier 331. A first end and a second end of the first resistor 337 are respectively coupled to the first input terminal J11 of the second operational amplifier 331 and the inverting output terminal VOUTN of the first operational amplifier 310. A first end and a second end of the second capacitor 335 are respectively coupled to the second input terminal J12 of the second operational amplifier 331 and the second output terminal of the second operational amplifier 331. A first end and a second end of the second resistor 339 are respectively coupled to the second input terminal J12 of the second operational amplifier 331 and the non-inverting output terminal VOUTP of the first operational amplifier 310. Therefore, the feedback gain circuit 330 has a function of a differential integrator.

In the embodiment of FIG. 3, when the input signal IP and the input signal IO of the first operational amplifier 310 has a DC offset error, the DC offset error is amplified by the gain of the first operational amplifier 310 and is output through the output signals OUTN and OUTP. In order to cancel the DC offset, the feedback circuit 330 integrates the output signals OUTN and OUTP containing the DC offset to obtain the DC offset information therein, and feeds back the DC offset information (i.e. the feedback signals FBN and FBP) to the second output transconductance stage 305 of the first operational amplifier 310. The second input transconductance stage 305 can generate the corresponding current to the output stage 307 according to the feedback signals FBN and FBP for compensating/cancelling the DC offset component in a bias current output to the output stage 307 by the first input transconductance stage 303. While cancelling the DC offset, the second output transconductance stage 305 also suppresses the noise in the feedback gain circuit 330.

Figure 4:
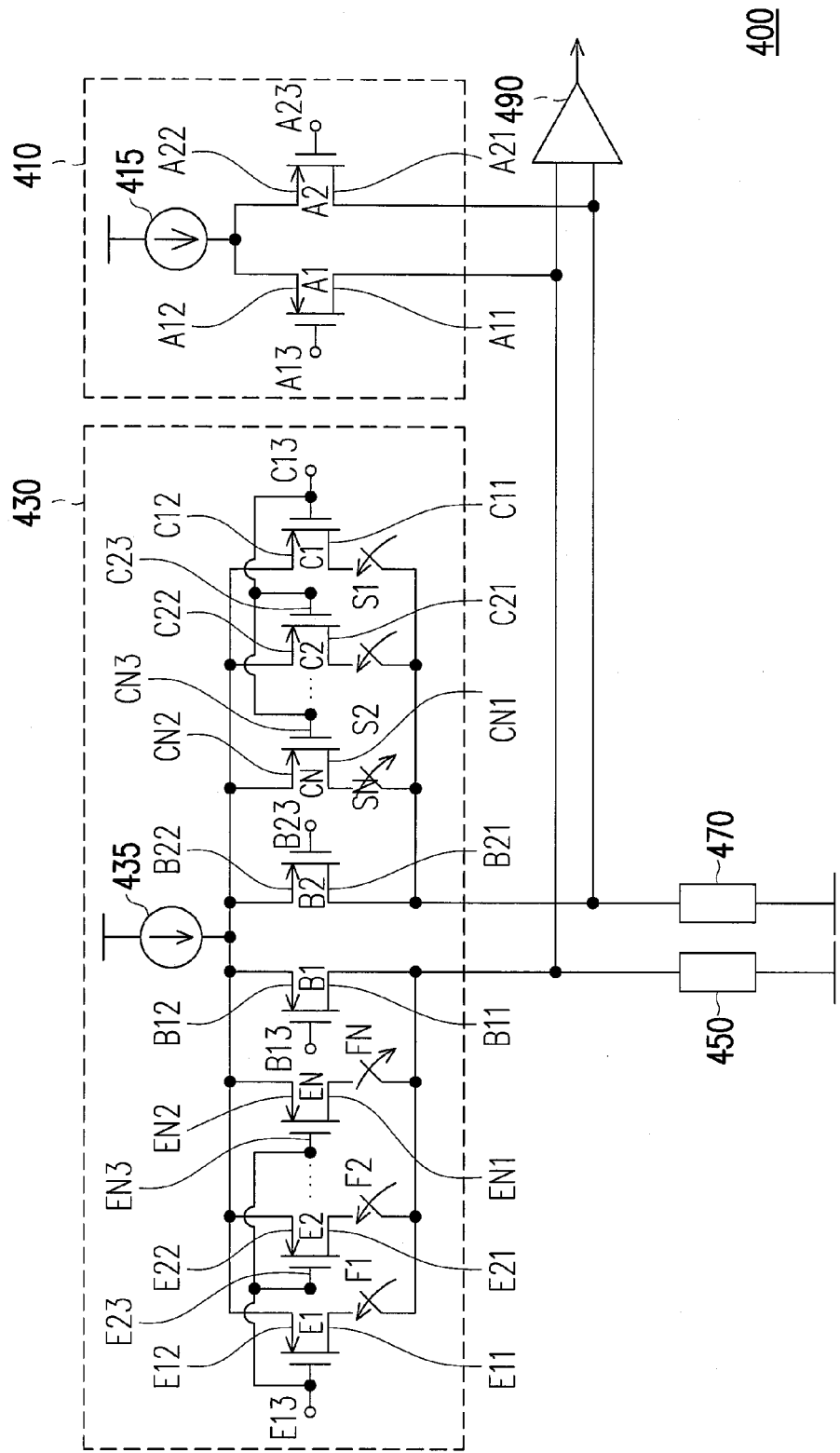
FIG. 4 is a circuit schematic diagram of an operational amplifier in a DC offset cancellation circuit according to an embodiment of the invention.

In the invention, in order to maintain consistence of a high pass frequency under different signal gains, a transconductance value of the second input transconductance stage 305 can be varied along with the signal gains. In case that the bias current is not influenced, the operational amplifier 310 may apply a mutual coupling method to achieve the requirement of different transconductances. For example, FIG. 4 is a circuit schematic diagram of an operational amplifier 400 in a DC offset cancellation circuit according to a second embodiment of the invention. The operational amplifier 400 includes a first input transconductance stage 410, a second input transconductance stage 430, an impedance 450, an impedance 470 and an output stage 490. The impedance 450 and the impedance 470 can be transistors, resistors or other impedance devices. In some embodiments, the impedance 450 and the impedance 470 may be included in the first input transconductance stage 410, the second input transconductance stage 430 or the output stage 490.

Implementation of the first input transconductance stage 203 shown in FIG. 2 and/or the first input transconductance stage 303 shown in FIG. 3 can be deduced with reference of related description of the first input transconductance stage 410 of FIG. 4. Implementation of the second input transconductance stage 205 shown in FIG. 2 and/or the second input transconductance stage 305 shown in FIG. 3 can be deduced with reference of related description of the second input transconductance stage 430 of FIG. 4. Implementation of the output stage 207 shown in FIG. 2 and/or the output stage 307 shown in FIG. 3 can be deduced with reference of related description of the output stage 490 of FIG. 4.

For example, the first input transconductance stage 410 in FIG. 4 can be regarded as a circuit schematic diagram of the first input transconductance stage 303 in FIG. 3, and the second input transconductance stage 430 in FIG. 4 can be regarded as a circuit schematic diagram of the second input transconductance stage 305 in FIG. 3. Referring to FIG. 3 and FIG. 4, the first input transconductance stage 410 includes a differential transistor pair and a current source 415, where the differential transistor pair includes a first transistor A1 and a second transistor A2. A control terminal A13 of the first transistor A1 and a control terminal A23 of the second transistor A2 respectively serve as the first input terminal J1 and the second input terminal J2 of the first input transconductance stage 303 for respectively receiving the input signal IP and the input signal IO. On the other hand, a first terminal A11 of the first transistor A1 and a first terminal A21 of the second transistor A2 respectively serve as the first signal output terminal J5 and the second signal output terminal J6 of the first input transconductance stage 303. A second terminal A1t of the first transistor A1 and a second terminal A22 of the second transistor A2 are commonly coupled to the current source 415.

The second input transconductance stage 430 includes a first transistor B1, a second transistor B2, N fourth transistors (for example, C1, C2, . . . , CN shown in FIG. 4), N third transistors (for example, E1, E2, . . . , EN shown in FIG. 4), N second switches (for example, S1, S2, . . . , SN shown in FIG. 4), N first switches (for example, F1, F2, . . . , FN shown in FIG. 4) and a current source 435, where N is a positive integer. A control terminal B13 of the first transistor B1 and a control terminal B23 of the second transistor B2 are respectively coupled to the first input terminal J3 of the second input transconductance stage 305 and the second input terminal J4 of the second input transconductance stage 305. A first terminal B11 of the first transistor B1 and a first terminal B21 of the second transistor B2 are respectively coupled to the first signal output terminal J7 and the second signal output terminal J8 of the second input transconductance stage 305. A second terminal B12 of the first transistor B1 and a second terminal B22 of the second transistor B2 are commonly coupled to the current source 435. On the other hand, in the first input transconductance stage 410, the first terminal A11 of the first transistor A1 and the first terminal A21 of the second transistor A2 are coupled to the first terminal B11 of the first transistor B1 and the first terminal B21 of the second transistor B2 in the second input transconductance stage 430, and are commonly coupled to the input terminal of the output stage 490, which are similar to the coupling relation between the first input transconductance stage 303, the second input transconductance stage 305 and the output stage 307 shown in FIG. 3.

In the second input transconductance stage 430, control terminals C13, C23, . . . , CN3 of the fourth transistors C1-CN are commonly coupled to the first input terminal J3 of the second input transconductance stage 305. Control terminals E13, E23, . . . , EN3 of the third transistors E1-EN are commonly coupled to the second input terminal J4 of the second input transconductance stage 305. Second terminals C12, C22, . . . , CN2 of the fourth transistors C1-CN are coupled to the second terminal 22 of the second transistor B2. Second terminals E12, E22, . . . , EN2 of the third transistors E1-EN are coupled to the second terminal 12 of the first transistor B1. Moreover, second terminals of the second switches S1-SN are respectively coupled to the first terminals C11, C21, . . . , CN1 of the fourth transistors C1-CN, and first terminals of the second switches S1-SN are coupled to the first terminal B21 of the second transistor B2. Second terminals of the first switches F1-FN are respectively coupled to the first terminals E11-EN1 of the third transistors E1-EN, and first terminals of the first switches F1-FN are commonly coupled to the first terminal B11 of the first transistor B1.

In the embodiment of the invention, the second input transconductance stage 430 produces transconductance through mutual collaboration of the first transistor B1 and the second transistor B2. By controlling conduction states of the first switches F1-FN, and controlling the conduction stats of the second switches S1-SN, the third transistors E1-EN and the fourth transistors C1-CN may provide different transconductances. In this way, in case that the bias current provided to the output stage 490 is not influenced, the second input transconductance stage 430 may adopt a mutual coupling structure (shown in FIG. 4) to provide/adjust different transconductances. Therefore, the second input transconductance stage 430 may adjust the corresponding transconductance according to different circuit status, so as to satisfy the requirement on different transconductances.

Implementations of the second input transconductance stage 205 of FIG. 2 and/or the second input transconductance stage 305 of FIG. 3 are not limited to the embodiment of FIG. 4. For example, in other embodiments, implementations of the second input transconductance stage 205 of FIG. 2 and/or the second input transconductance stage 305 of FIG. 3 can be deduced according to related description of FIG. 5 or FIG. 6.

Figure 5:
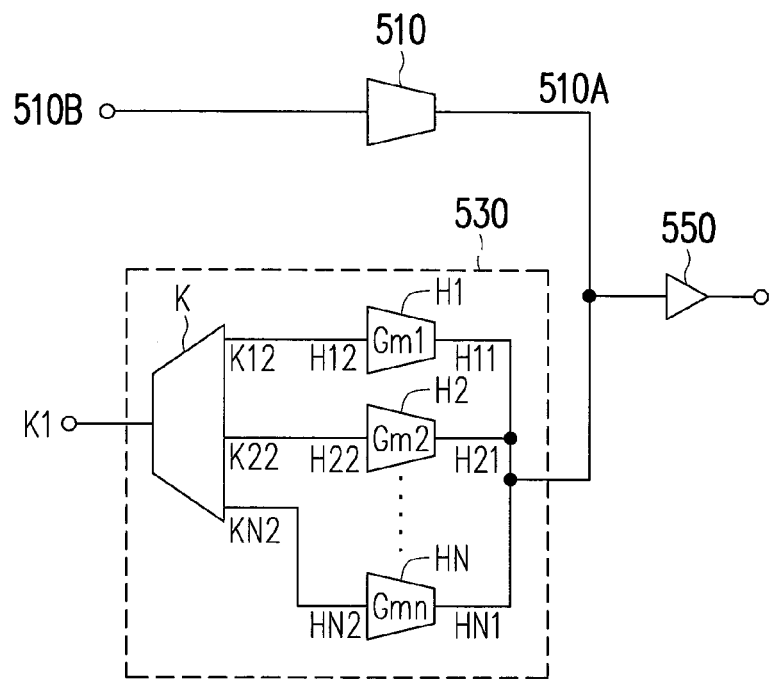
FIG. 5 is a circuit schematic diagram of an operational amplifier in a DC offset cancellation circuit according to another embodiment of the invention.

FIG. 5 is a circuit schematic diagram of an operational amplifier 500 in a DC offset cancellation circuit according to another embodiment of the invention. A first input transconductance stage 510, a second input transconductance stage 530 and an output stage 550 in FIG. 5 may respectively represent the first input transconductance stage 203, the second input transconductance stage 205 and the output stage 207 of the operational amplifier 210 in FIG. 2. Alternatively, the first input transconductance stage 510, the second input transconductance stage 530 and the output stage 550 in FIG. 5 may respectively represent the first input transconductance stage 303, the second input transconductance stage 305 and the output stage 307 of the operational amplifier 310 in FIG. 3. The second input transconductance stage 530 includes a plurality of transconductance circuits H1, H2, . . . , HN and a switching device K. A plurality of signal output terminals H11, H21, . . . , HN1 of the transconductance circuits H1-HN are commonly coupled to a signal output terminal 510A of the first input transconductance stage 510, and are commonly coupled to a signal input terminal of the output stage 550.

The transconductance circuits H1-HN respectively have different gain values Gm1, Gm2, . . . , Gmn. On the other hand, a signal input terminal 510B of the first input transconductance stage 510 can serve as the signal input terminal of the first input transconductance stage 203 in FIG. 2 or the signal input terminal of the first input transconductance stage 303 in FIG. 3.

Implementations of the first input transconductance stage 510 and the transconductance circuits H1-HN are not limited by the invention. For example, in some embodiments, implementations of the first input transconductance stage 510 and the transconductance circuits H1-HN may refer to related description of the first input transconductance stage 410 or the second input transconductance stage 430 of FIG. 4.

In the embodiment of the invention, the switching device K can be implemented by a demultiplexer. A first terminal K1 of the switching device K may serve as the signal input terminal of the second input transconductance stage 205 in FIG. 2 or the input terminal of the second input transconductance stage 305 of FIG. 3. Moreover, a plurality of second terminals K12, K22, . . . , KN2 of the switching device K are one-to-one coupled to a plurality of signal input terminals H12, H22, . . . , HN2 of the transconductance circuits H1-HN, respectively. The switching device K selectively couples the first terminal K1 to at least one of the second terminals K12-KN2 of the switching device K. Therefore, through the switching operation of the switching device K, one of the gain values can be selected from the different gain values Gm1-Gmn of the transconductance circuits H1-HN to serve as the gain value of the second input transconductance circuit 530.

Figure 6:
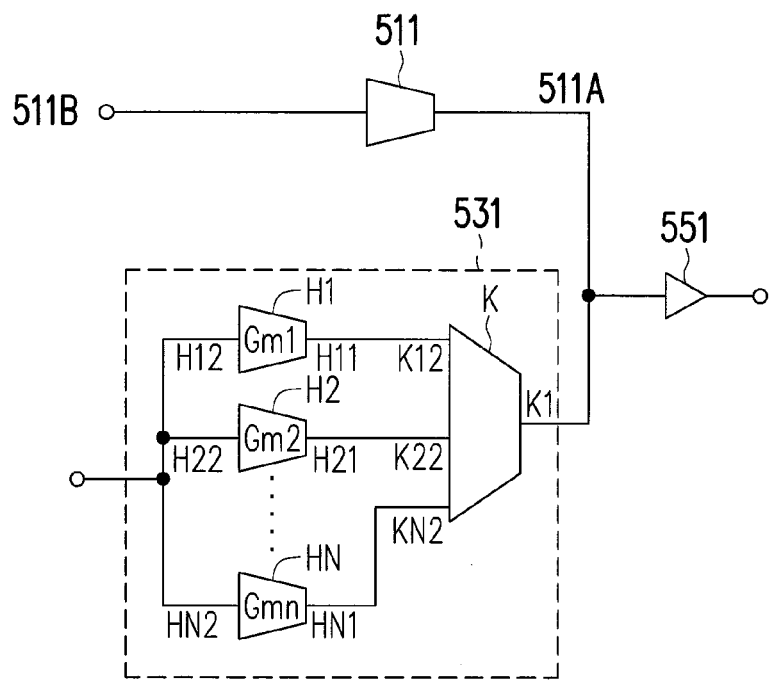
FIG. 6 is a circuit schematic diagram of an operational amplifier in a DC offset cancellation circuit according to still another embodiment of the invention.

FIG. 6 is a circuit schematic diagram of an operational amplifier 600 in a DC offset cancellation circuit according to still another embodiment of the invention. A first input transconductance stage 511, a second input transconductance stage 531 and an output stage 551 in FIG. 6 may respectively represent the first input transconductance stage 203, the second input transconductance stage 205 and the output stage 207 of the operational amplifier 210 in FIG. 2. Alternatively, the first input transconductance stage 511, the second input transconductance stage 531 and the output stage 551 in FIG. 6 may respectively represent the first input transconductance stage 303, the second input transconductance stage 305 and the output stage 307 of the operational amplifier 310 in FIG. 3.

Referring to FIG. 6, the second input transconductance stage 531 includes a plurality of transconductance circuits H1, H2, . . . , HN and a switching device K. Implementations of the first input transconductance stage 511 and the transconductance circuits H1-HN are not limited by the invention. For example, in some embodiments, implementations of the first input transconductance stage 511 and the transconductance circuits H1-HN may refer to related description of the first input transconductance stage 410 or the second input transconductance stage 430 of FIG. 4. A plurality of signal input terminals H12, H22, . . . , HN2 of the transconductance circuits H1-HN are commonly coupled to an input terminal of the second input transconductance stage 531, where the transconductance circuits H1-HN respectively have different gain values Gm1, Gm2, . . . , Gmn. The switching device K can be implemented by a multiplexer. A first terminal K1 of the switching device K and a signal output terminal 511A of the first input transconductance stage 511 are commonly coupled to the signal input terminal of the output stage 551. A plurality of second terminals K12, K22, . . . , KN2 of the switching device K are one-to-one coupled to a plurality of signal output terminals H11, H21, . . . , HN1 of the transconductance circuits H1-HN, respectively. The switching device K selectively couples the first terminal K1 to at least one of the second terminals K12-KN2 of the switching device K. Moreover, operation methods of the first input transconductance stage 511 and the output stage 551 can be deduced with reference of related descriptions of FIG. 5.

Moreover, implementations of the second input transconductance stage 205 of FIG. 2 and the second input transconductance stage 305 of FIG. 3 are not limited to the related descriptions of FIG. 5 and FIG. 6. For example, in another embodiment of the invention, in case that the transconductance circuits H1-HN of FIG. 5 has an enabling/disabling control function, the switching device K in FIG. 5 can be omitted, and the input terminals H12-HN2 of the transconductance circuits H1-HN are commonly coupled to the input terminal of the second input transconductance stage 530. Deduced by analogy, in case that the transconductance circuits H1-HN of FIG. 6 has the enabling/disabling control function, the switching device K in FIG. 6 can be omitted, and the signal output terminals H11-HN1 of the transconductance circuits H1-HN and the signal output terminal 511A of the first input transconductance stage 511 are commonly coupled to the signal input terminal of the output stage 551. The transconductance circuits H1-HN can be selectively enabled or disabled, respectively, and the suitable gain value can be selected from the transconductance circuits H1-HN.

Figure 7:
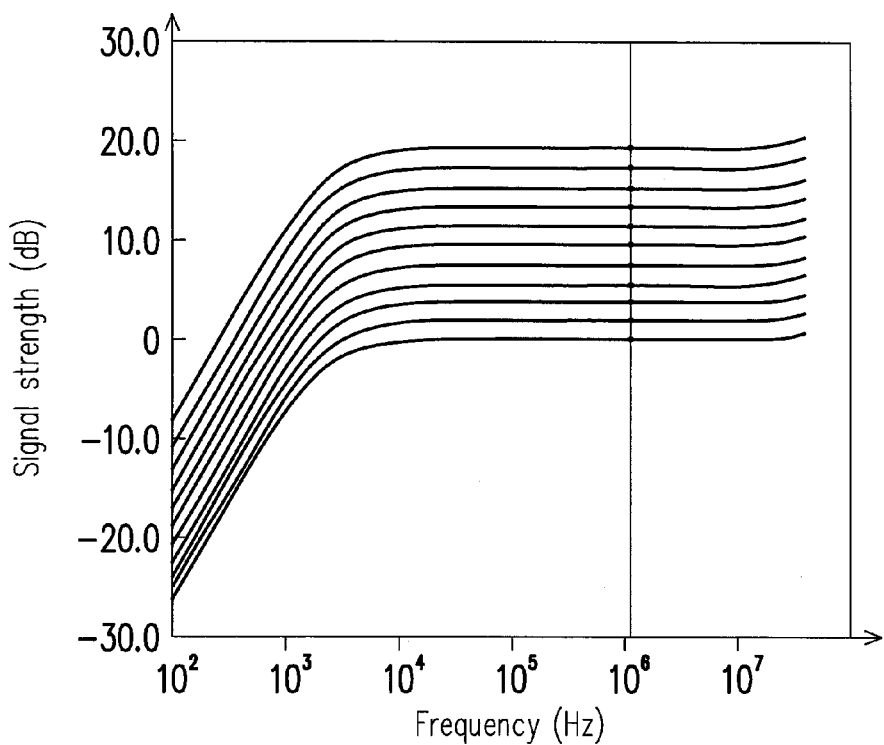
FIG. 7 is a schematic diagram of a frequency response simulation of an operational amplifier in a DC offset cancellation circuit according to an embodiment of the invention.

FIG. 7 is a schematic diagram of a frequency response simulation of an operational amplifier in a DC offset cancellation circuit according to an embodiment of the invention. A horizontal axis of the frequency response simulation of FIG. 7 represents a frequency of the operational amplifier with a unit of Hz, and a vertical axis represents a signal strength with a unit of dB. Different curves shown in FIG. 7 respectively represent output frequency response characteristics of the DC offset cancellation circuit 300 under different signal gains. According to FIG. 7, it is known that by correspondingly adjust the transconductance values of the second input transconductance stage 305, the high pass frequency of the DC offset cancellation circuit 300 can be maintained consistent.

Figure 8:
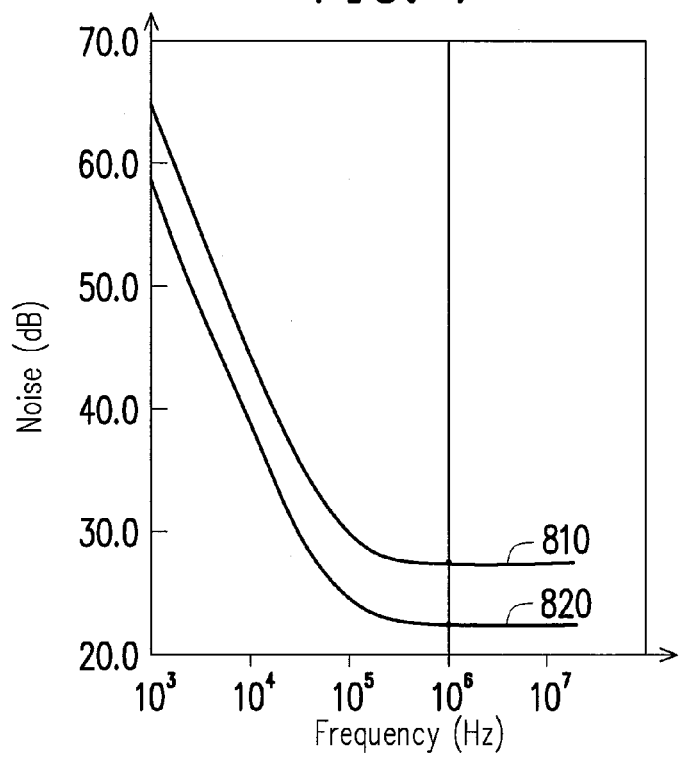
FIG. 8 is a schematic diagram of a noise figure simulation of a DC offset cancellation circuit according to an embodiment of the invention.

FIG. 8 is a schematic diagram of a noise figure simulation of a DC offset cancellation circuit according to an embodiment of the invention. A horizontal axis of FIG. 8 represents an output frequency of the DC offset cancellation circuit 300 with a unit of Hz, and a vertical axis represents noise with a unit of dB. Referring to a curve 810 and a curve 820 in FIG. 8, the curve 810 is a noise figure curve of the DC offset cancellation circuit 100 of FIG. 1, and a curve 820 is a noise figure curve of the DC offset cancellation circuit 300 of FIG. 3. Comparing the cure 810 and the curve 820, under a same gain condition, the noise figure of the curve 820 is obviously smaller than the noise figure of the curve 810. According to a simulation result of FIG. 8, it is known that the DC offset cancellation circuit 300 of FIG. 3 may mitigate the problem of amplifying the noise of the feedback path occurred in the DC offset cancellation circuit 100 of FIG. 1.

In summary, the operational amplifier in the DC offset cancellation circuit applies input a transconductance circuit (for example, the first input transconductance stage 203 of FIG. 2 or the first input transconductance stage 303 of FIG. 3) to receive the input signal, and the feedback signal output by the feedback gain circuit is transmitted to another input transconductance circuit (for example, the second input transconductance stage 205 of FIG. 2 or the second input transconductance stage 305 of FIG. 3) of the operational amplifier. While the DC offset cancellation circuit cancels the DC offset error of the first input transconductance stage by using the second input transconductance stage, the DC offset cancellation circuit also uses the second input transconductance stage to suppress the noise in the feedback gain circuit. Since the DC offset cancellation circuit does not add the noise of the feedback signal to the input signal of the operational amplifier, the noise of the feedback gain circuit is effectively suppressed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A direct current (DC) offset cancellation circuit, comprising:
  a first operational amplifier, comprising a first input transconductance stage, a second input transconductance stage and an output stage, wherein an input terminal of the first input transconductance stage receives an input signal of the first operational amplifier through a first input terminal of the first operational amplifier, and an output terminal of the output stage outputs an output signal of the first operational amplifier through an output terminal of the first operational amplifier; and
  a feedback gain circuit, wherein an input terminal of the feedback gain circuit is coupled to the output terminal of the first operational amplifier, and an output terminal of the feedback gain circuit is coupled to an input terminal of the second input transconductance stage through a second input terminal of the first operational amplifier.

2. The DC offset cancellation circuit as claimed in claim 1, wherein the input terminal of the first input transconductance stage comprises a first input terminal and a second input terminal, and the first input transconductance stage comprises:
  a first transistor, having a control terminal coupled to the first input terminal of the first input transconductance stage, and a first terminal coupled to a first signal output terminal of the first input transconductance stage;
  a second transistor, having a control terminal coupled to the second input terminal of the first input transconductance stage, and a first terminal coupled to a second signal output terminal of the first input transconductance stage; and
  a current source, coupled to a second terminal of the first transistor and a second terminal of the second transistor.

3. The DC offset cancellation circuit as claimed in claim 1, wherein the input terminal of the second input transconductance stage comprises a first input terminal and a second input terminal, and the second input transconductance stage comprises:
  a current source;
  a first transistor, having a control terminal coupled to the first input terminal of the second input transconductance stage, a first terminal coupled to a first signal output terminal of the second input transconductance stage, and a second terminal coupled to the current source; and
  a second transistor, having a control terminal coupled to the second input terminal of the second input transconductance stage, a first terminal coupled to a second signal output terminal of the second input transconductance stage, and a second terminal coupled to the current source.

4. The DC offset cancellation circuit as claimed in claim 3, wherein the second input transconductance stage further comprises:
  at least one first switch, having a first terminal coupled to the first terminal of the first transistor;
  at least one third transistor, having a control terminal coupled to the second input terminal of the second input transconductance stage, a first terminal coupled to a second terminal of the first switch, and a second terminal coupled to the second terminal of the first transistor;
  at least one second switch, having a first terminal coupled to the first terminal of the second transistor; and
  at least one fourth transistor, having a control terminal coupled to the first input terminal of the second input transconductance stage, a first terminal coupled to a second terminal of the second switch, and a second terminal coupled to the second terminal of the second transistor.

5. The DC offset cancellation circuit as claimed in claim 1, wherein the second input transconductance stage comprises:
  a plurality of transconductance circuits, wherein a plurality of signal output terminals of the transconductance circuits and a signal output terminal of the first input transconductance stage are commonly coupled to a signal input terminal of the output stage, wherein the transconductance circuits respectively have different gain values; and
  a switching device, having a first terminal coupled to the input terminal of the second input transconductance stage, and a plurality of second terminals one-to-one coupled to a plurality of signal input terminals of the transconductance circuits respectively, wherein the switching device selectively couples the first terminal of the switching device to at least one of the second terminals of the switching device.

6. The DC offset cancellation circuit as claimed in claim 5, wherein the switching device comprises:
  a demultiplexer, having an input terminal coupled to the first terminal of the switching device, and a plurality of output terminals one-to-one coupled the second terminals of the switching device, respectively.

7. The DC offset cancellation circuit as claimed in claim 1, wherein the second input transconductance stage comprises:
  a plurality of transconductance circuits, having a plurality of signal input terminals commonly coupled to the input terminal of the second input transconductance stage, wherein the transconductance circuits respectively have different gain values; and
  a switching device, having a first terminal coupled to a signal input terminal of the output stage, and a plurality of second terminals one-to-one coupled to a plurality of signal output terminals of the transconductance circuits respectively, wherein the switching device selectively couples the first terminal of the switching device to at least one of the second terminals of the switching device.

8. The DC offset cancellation circuit as claimed in claim 7, wherein the switching device comprises:
  a multiplexer, having an output terminal coupled to the first terminal of the switching device, and a plurality of input terminals one-to-one coupled the second terminals of the switching device, respectively.

9. The DC offset cancellation circuit as claimed in claim 1, wherein the second input transconductance stage comprises:
  a plurality of transconductance circuits, having a plurality of input terminals commonly coupled to the input terminal of the second input transconductance stage, wherein a plurality of signal output terminals of the transconductance circuits and a signal output terminal of the first input transconductance stage are commonly coupled to a signal input terminal of the output stage, wherein the transconductance circuits respectively have different gain values, and the transconductance circuits are selectively enabled, respectively.

10. The DC offset cancellation circuit as claimed in claim 1, wherein a signal output terminal of the first input transconductance stage and a signal output terminal of the second input transconductance stage are commonly coupled to a signal input terminal of the output stage.

11. The DC offset cancellation circuit as claimed in claim 1, further comprising:
  a first resistor, coupled to the first input terminal of the first operational amplifier for providing the input signal; and
  a second resistor, having a first terminal and a second terminal respectively coupled to the first input terminal of the first operational amplifier and the output terminal of the first operational amplifier.

12. The DC offset cancellation circuit as claimed in claim 1, wherein the feedback gain circuit comprises:
  a second operational amplifier, having an output terminal coupled to the input terminal of the second input transconductance stage through the second input terminal of the first operational amplifier, and a first input terminal coupled to a reference voltage;
a capacitor, having a first terminal and a second terminal respectively coupled to a second input terminal of the second operational amplifier and the output terminal of the second operational amplifier; and
a resistor, having a first terminal and a second terminal respectively coupled to the second input terminal of the second operational amplifier and the output terminal of the first operational amplifier.

13. The DC offset cancellation circuit as claimed in claim 1, wherein the input terminal of the second input transconductance stage comprises a first input terminal and a second input terminal, the output terminal of the first operational amplifier comprises a first output terminal and a second output terminal, and the feedback gain circuit comprises:
a second operational amplifier, having a first output terminal coupled to the first input terminal of the second input transconductance stage, and a second output terminal coupled to the second input terminal of the second input transconductance stage;
a first capacitor, having a first terminal and a second terminal respectively coupled to a first input terminal of the second operational amplifier and the first output terminal of the second operational amplifier;
a first resistor, having a first terminal and a second terminal respectively coupled to the first input terminal of the second operational amplifier and the first output terminal of the first operational amplifier;
a second capacitor, having a first terminal and a second terminal respectively coupled to a second input terminal of the second operational amplifier and the second output terminal of the second operational amplifier; and
a second resistor, having a first terminal and a second terminal respectively coupled to the second input terminal of the second operational amplifier and the second output terminal of the first operational amplifier.

14. The DC offset cancellation circuit as claimed in claim 1, wherein the first input transconductance stage has a first gain, and the second input transconductance stage has a second gain, wherein the second gain is a variable gain.

* * * * *